Figure 1:
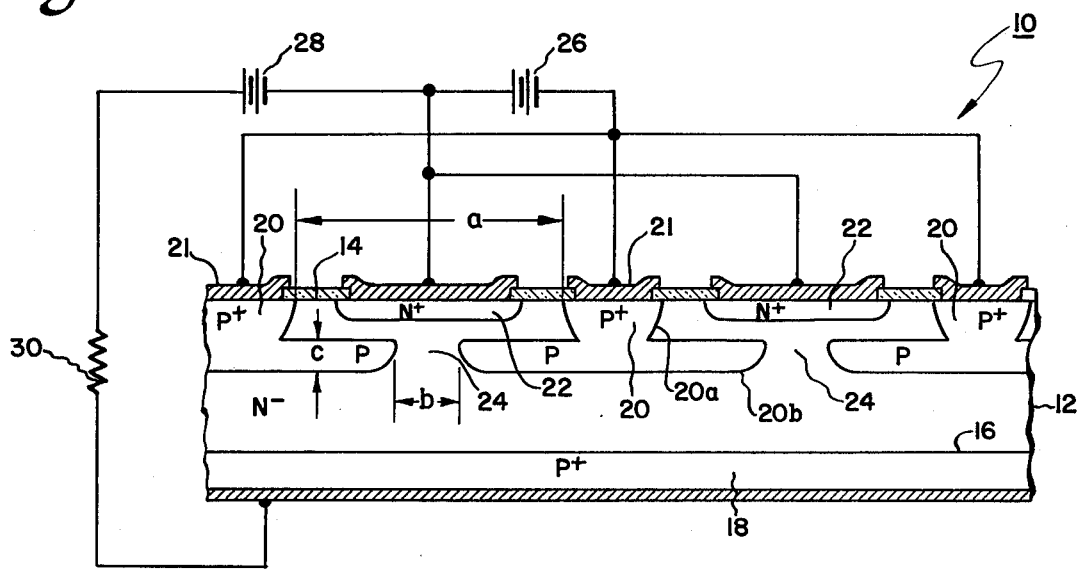

United States Patent
Houston et al.

[11] 4,060,821
[45] Nov. 29, 1977

[54] FIELD CONTROLLED THYRISTOR WITH BURIED GRID

[75] Inventors: Douglas E. Houston; Surinder Krishna, both of Ballston Lake, N.Y.

[73] Assignee: General Electric Co., Schenectady, N.Y.

[21] Appl. No.: 697,984

[22] Filed: June 21, 1976

[51] Int. Cl.$^2$ ............................................. H01L 29/80
[52] U.S. Cl. ...................................... 357/22; 357/20; 357/38; 357/45
[58] Field of Search .................. 357/22, 38, 45, 20

[56] References Cited

U.S. PATENT DOCUMENTS

| | | | |
|---|---|---|---|
| 3,363,153 | 1/1968 | Zloczower | 357/22 |
| 3,398,337 | 8/1968 | So | 357/22 |
| 3,439,192 | 4/1969 | Teszner | 357/22 |
| 3,465,216 | 9/1969 | Teszner | 357/22 |
| 3,497,777 | 2/1970 | Teszner | 357/22 |
| 3,841,917 | 10/1974 | Shannon | 357/22 |

FOREIGN PATENT DOCUMENTS

| | | | |
|---|---|---|---|
| 1,361,920 | 4/1966 | France | 357/22 |
| 2,233,786 | 1/1974 | Germany | 357/38 |
| 436,492 | 11/1967 | Switzerland | 357/22 |

OTHER PUBLICATIONS

A. Erikson, "New Tecnetrons Switch 15 Amp", Electronics, Sept. 6, 1963, pp. 75, 76.
"Field Controlled Thyristor is Faster," Electronic Engineering, Jan. 1976, p. 5.

*Primary Examiner*—Stanley D. Miller, Jr.
*Assistant Examiner*—Joseph E. Clawson, Jr.
*Attorney, Agent, or Firm*—Jerome C. Squillaro; Joseph T. Cohen; Julius J. Zaskalicky

[57] ABSTRACT

A novel grid structure for a field controlled thyristor includes a current controlling grid structure interdigitated with a cathode structure in which the surface area of the cathode structure is substantially greater than that of the grid structure. High forward blocking voltage gain (anode voltage/grid voltage) and low on-state losses in a turn-off type field controlled thyristor are accomplished by providing a surface grid portion and a buried portion which are connected to the surface grid structure and substantially underlies the cathode structure. The buried grid structure is constructed in a manner to provide a high aspect ratio for the channel region.

5 Claims, 4 Drawing Figures

FIELD CONTROLLED THYRISTOR WITH BURIED GRID

The present invention relates to semiconductor devices and more particularly to an electric field controlled thyristor in which current flow from anode to cathode is controlled by an electric field interposed therebetween by a grid structure appropriately biased relative to the cathode region.

Electric field controlled semiconductor devices such as field effect transistors, semiconductor controlled rectifiers, thyristors and charge transfer devices are well known in the art. For example, the patents to Schockly, U.S. Pat. No. 2,744,970 and Dacey, U.S. Pat. No. 2,778,956, relate to field effect transistor devices in which the current flow through a semiconductor body is controlled by the application of an electric field generating voltage to a gate electrode located on the semiconductor body in a way to modulate current flow therethrough. Dacey, for example, includes a gate zone on the exterior sides of a semiconductor body having source and drain contacts at the ends thereof.

In the area of high power field controlled semiconductor devices, U.S. Pat. No. 3,025,438 to Wegener relates to a plurality of cylindrical semiconductor elements of one conductivity type surrounded by different conductivity type material. As described by Wegener, this is a majority carrier device with the field effect region created by the cylindrical regions arranged in rows and columns and joining opposed layers of similar conductivity type semiconductor material. The cylindrical elements are surrounded by a gate material of differing conductivity type with only contacts to the layers and the gate region.

U.S. Pat. No. 3,227,896 to Teszner also discloses a power switching field effect transistor utilizing a grid surrounding opposite conductivity type channels for controlling current flow. To overcome apparent conduction limitations in the device, Teszner describes the use of a diode shunted by non-linear resistance to provide sufficient minority carrier injection. The structure described as providing this function is a thin oxide layer covered by an opposite conductivity type semiconductor material piercing the oxide at selected locations. Unfortunately, such a structure does not sustain very high voltages nor is it very reproducible, and hence is unsatisfactory for most applications.

In U.S. Pat. No. 3,274,461, Teszner describes a bulk field effect device using majority carrier conduction. Teszner also appears to disclose a buried grid field terminated diode utilizing a diffused grid of P-type conductivity in an N-type substrate with an epitaxially grown layer of N-type conductivity overlying the P-type grid. While the buried grid structure described by Teszner may be adequate for certain applications, where high forward blocking voltage gain and low on state losses are required, and further where a substantially planar structure is desired, the devices described by Teszner fail to adequately meet these requirements.

Accordingly, it is an object of this invention to provide a field controlled thyristor exhibiting high forward blocking voltage gain and low on-state losses in a turn-off type device.

It is yet another object of this invention to provide a field controlled thyristor with a planar grid structure with substantially greater cathode surface area than grid surface area while simultaneously providing a high forward blocking voltage gain. Briefly, in accordance with one preferred embodiment of the present invention, a field controlled thyristor structure comprises a semiconductor substrate with a uniform anode injecting region formed in one major surface of the substrate and a current controlling grid (or gate) region including a surface portion and a buried portion in the other major surface. The interstices of the surface portion of the grid include a plurality of electrically interconnected cathode regions of high injection efficiency for majority carriers while the anode region provides a highly efficient source of minority carriers. The buried portion of the grid structure extends laterally under adjacent cathode regions and is spaced from the next adjacent buried grid by a width, $b$, the spacing therebetween referred to as the channel region. Each buried grid has a depth, $c$, with the ratio of the depth to the width substantially determining the magnitude of the grid-to-cathode voltage required to block substantial current flow from anode to cathode with a given anode-to-cathode voltage. Electrode means contacting the anode, cathode and grid regions provide means for controlling current flow through the device.

Figure 2:
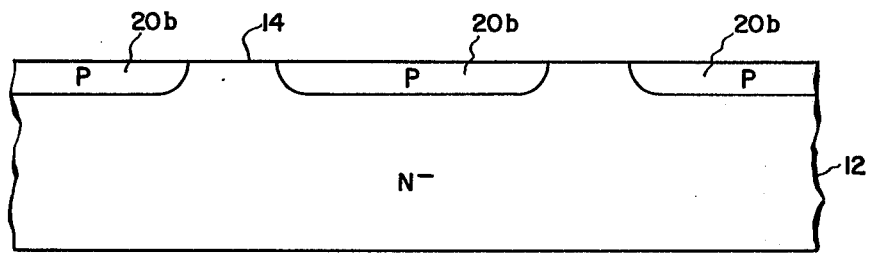
Figure 3:
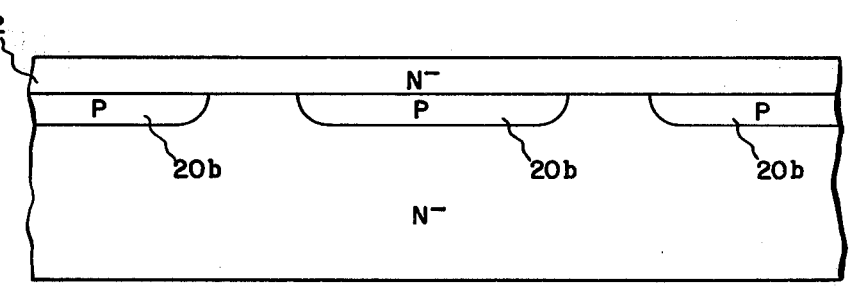
Figure 4:
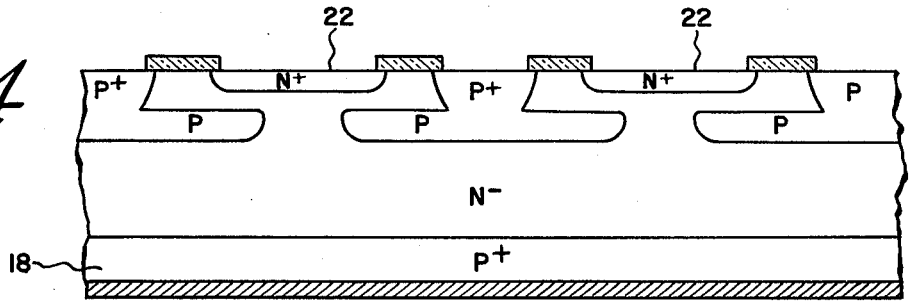

Other objects and advantages of the invention, along with a more complete description thereof are provided below in conjunction with the accompanying drawings in which:

FIG. 1 is a sectional view of a field terminated diode structure constructed in accordance with the present invention; and FIGS. 2, 3, and 4 are partial sectional views illustrating a method of constructing the device illustrated in FIG. 1.

FIG. 1 illustrates an embodiment of a field controlled thyristor structure 10 comprising a semiconductor substrate 12 of one-type conductivity, such as N-type conductivity, preferably of silicon semiconductor material. The substrate 12 includes two opposed major surfaces 14 and 16 with an anode region 18 of P+-type conductivity formed in the surface 16. Advantageously the anode region 18 is formed by diffusion of conductivity modifying impurities into the substrate 12. Alternatively, other techniques such as epitaxial growth, thermal gradient zone melting or ion implantation may be employed, if desired.

The surface 14 of the substrate is provided with a current controlling grid structure 20, generally of P-type conductivity, formed by any one of the aforementioned processes, for example. The grid structure 20 comprises a plurality of individual surface-adjacent regions of P+-type conductivity contacting buried grid portions 20b of P-type conductivity. The surface-adjacent grid regions 20a are spaced apart from each other by a distance $a$, and are electrically interconnected by electrode means 21 to enable the application of bias voltages thereto in a manner described below. It is to be understood that the sectional view of the grid structure illustrated in FIG. 1 may be a sectional view of a square, rectangular, circular or spiral grid structure, for example, and the invention is not limited to any specific configuration.

Within the interstices defined by the surface portions of the interconnecting grid structure 20 are a plurality of electrically interconnected cathode regions 22 of N+-type conductivity. The higher conductivity of the cathode regions 22, preferably formed by one of the aforementioned processes, facilitate electrical contact to these regions of the substrate and additionally increase the injection efficiency of majority carriers into the semiconductor substrate.

As is evident from FIG. 1 of the drawing, the surface area of the cathode regions 22 is larger than the surface area of the grid (or gate) regions 20. As a result of this increased surface area of the cathode region, the forward voltage drop of the device more nearly approximates that of a typical P-N junction diode, i.e., 0.7 to 1.0 volts for a silicon device. Since the field controlled thyristor described herein is intended primarily for applications involving the control and interruption of large currents, i.e., in excess of 10 amperes to thousands of amperes, it is particularly desirable to provide as large a cathode area as possible to minimize the voltage drop of the device.

Of equal importance to minimal voltage drop is the ability to interrupt current flow through the device by the application of as small a grid-to-cathode voltage as possible. Those skilled in the art can readily appreciate that the application of such a voltage to the grid of the field controlled thyristor produces a depletion region around the individual gate regions, the magnitude of which depletion region varies with the magnitude of the applied voltage. In accordance with one of the novel aspects of the present invention, a grid structure is provided which insures the current interrupt or turn-off capability of the thyristor with minimal gate-to-cathode voltages. More specifically, as illustrated in FIG. 1, the buried grid regions 20b extend laterally beneath the adjacent cathode regions 22 and are spaced from the next adjacent buried gate region 20b by a distance, illustrated in FIG. 1 by the letter b and generally referred to as the channel region 24. In addition to the spacing between adjacent gate regions, the thickness or depth, c, of the buried gate region also influences the turn-off capability of the thyristor. More specifically, for a given substrate resistivity the magnitude of the gate-to-cathode voltage necessary to produce forward blocking of the field-controlled thyristor is dependent on the aspect ratio (depth $c$/width $b$) of the channel region 24 between the adjacently spaced buried grid regions 20b. In accordance with the present invention, a useful range of aspect ratios is 0.5 to 5.0, although ratios outside this range may be useful for certain applications.

Obviously, those skilled in the art can readily appreciate that the magnitude of the gate-to-cathode voltage necessary to produce a "pinched-off" condition in the field controlled thyristor structure described above is in many respects similar to that of a field effect transistor. More specifically, the magnitude of the voltage required between the gate and cathode necessary to cause adjacent depletion regions surrounding the buried gate regions 20b to intersect is designated as the pinch-off voltage. The attainment of a pinched-off condition obviously interrupts current flow from the anode-to-cathode regions and hence places the thyristor in a current-blocking mode. Upon removal of this voltage, current is then permitted to flow from anode to cathode in a substantially unrestricted manner.

FIG. 1 also illustrates a typical arrangement for utilizing the field controlled thyristor in an electrical circuit configuration. More specifically, FIG. 1 illustrates the cathode regions 22 being connected together and to the positive terminal of a voltage source 26, the negative terminal of which is connected to the grid regions 20. Another voltage source 28 has its negative terminal connected to the positive terminal of the voltage source 26 and the positive terminal connected through a load impedance 30 to the anode region 18. As described previously, the function of the voltage source 26 is to provide a reverse bias voltage to the gate region 20 relative to the cathode region 22, thereby causing the formation of a depletion region, the magnitude of which varies with the magnitude of the applied voltage from the source 26. The voltage source 28, on the other hand, provides power to the load impedance 30 in a manner substantially controlled by the magnitude of the voltage source 26.

The embodiment of the invention illustrated in FIG. 1 provides several significant advantages over prior art field controlled thyristors, namely, an improved turn-off capability (i.e., lower gate-to-cathode voltages to produce pinch-off), efficient utilization of semiconductor device area which results from a smaller surface area for the gate region than the cathode region, and low forward voltage drop. In should also be pointed out that the spacing, $a$, between surface adjacent grid regions 20a does not affect the aspect ratio of the channel region 24 which is determined solely by the spacing, $b$, and depth, $c$. Therefore, it is possible to provide a grid spacing substantially wider than is presently possible with prior art grid structures thereby providing a greater ratio of cathode area to grid area without losing the forward blocking capability of the device. The only limitation on the spacing between adjacent gate regions is that imposed by the lateral ohmic drop in the buried portion 20b of the gate region. However, this is not a severe limitation in most applications since the breakdown voltage between the gate and cathode regions can be made as high as 150 to 200 volts, for example, thus enabling a larger gate-to-cathode vias voltage to be applied to overcome the lateral ohmic drop.

Clearly, another advantage of the novel grid and cathode structure is the reduced requirement of close spacing of grid and cathode metallization (utilized for electrical contacts to these regions) which greatly simplifies fabrication while increasing the yield for large area devices.

A particularly useful method for making the field controlled thyristor structure illustrated in FIG. 1 is illustrated in FIGS. 2, 3 and 4. FIG. 2, for example, illustrates the formation of the buried grid regions 20b by selective diffusion of conductivity-modifying impurities into the surface 14 (with a surface concentration of approximately $5 \times 10^{16}$ cm$^{-3}$) of the substrate 12 of 50–70 ohm-cm N-type silicon, for example. An epitaxial layer 32 of N$^-$-type conductivity and approximately 10 microns thickness is then grown over the surface 14 to produce the buried grid region 20b. Utilizing standard planar processing techniques well known to those skilled in the art, selective P+-type diffusion are formed through the epitaxial layer 32 to contact the buried grid regions 20b in a manner illustrated in FIG. 4. Similarly, cathode regions 22 of N+-type conductivity are also formed in the epitaxial layer 32. Similarly, the anode region 18 and subsequent electrical contact thereto are also made by conventional planar processing techniques. Alternatively, ion implantation or thermal gradient zone migration may be utilized where appropriate or desirable. For example, ion implantation may be utilized to advantage by forming a shallow buried grid in the substrate, followed by growing an epitaxial layer thereover which would facilitate the growth of a high resistivity, high lifetime epitaxial layer without any auto-doping between the gate regions. Planar contacts to this implanted buried grid could then be made by a selective diffusion or thermal gradient zone migration.

By way of further example, devices constructed in accordance with the invention and having a buried grid region depth, $c$, of 15 microns and a channel region spacing, $b$, of 15 microns yield aspect ratios of one (or less depending on the curvature of the buried grid diffusion) and exhibit a forward blocking voltage gain of greater than 100 at an applied anode-to-cathode voltage of 100 volts or more. In general, it has been found that the forward blocking voltage gain increases with increasing anode-to-cathode voltage.

Those skilled in the art can readily appreciate that if the field controlled thyristor described herein is to be used primarily in inverter applications, the turn-off characteristic can be enhanced by making the buried gate region narrow to minimize the lateral ohmic drop. However, the improvement in ohmic drop is achieved at the expense of a lower cathode-to-grid area ratio. On the other hand, if the field controlled thyristor is intended primarily for phase control applications where the grid regions need not carry full current, the buried portion of the grid region may be made wide. Such a configuration would produce lower on-state losses due to the more efficient utilization of semiconductor surface area. In either case, however, the same gate aspect ratio is obtained and therefore the forward blocking capability is unaffected.

In summary, the field controlled thyristor of the present invention provides high forward blocking voltage gain with low on-state losses in a turn-off type device.

It will be apparent to those skilled in the art that various modifications may be made within the spirit and scope of the invention as described. For example, whereas the invention has been illustrated with respect to a P-N-N+ structure, obviously, an N-P-P+ structure may be employed if desired. Accordingly, the appended claims are intended to cover all such modifications and variations.

What we claim as novel and desire to secure by Letters Patent of the United States is:

1. A field controlled thyristor comprising:
    a semiconductor substrate of one type conductivity and having opposed major surfaces;
    a uniform anode injecting region of opposite type conductivity in one of said major surfaces;
    a current controlling grid structure comprising a plurality of surface-adjacent grid regions of opposite type conductivity in the other major surface and a like plurality of buried grid regions contacting said surface-adjacent grid regions, said surface-adjacent regions being of higher conductivity than said buried grid regions;
    a plurality of surface-adjacent cathode regions of one type conductivity in said other major surface and within the interstices of said surface-adjacent grid regions, said surface-adjacent cathode regions having a larger surface area than said surface-adjacent grid regions and a higher conductivity than said substrate; and
    wherein each of said buried grid regions are further characterized by having portions extending laterally under adjacent cathode regions and are spaced from the next adjacent buried grid region by a width, $b$, with each buried grid having a depth, $c$, the ratio of the depth to the width being in a range of 0.5 to 5.0 and substantially determining the magnitude of the grid-to-cathode voltage required to block substantial current flow from anode to cathode with a given anode-to-cathode voltage for a given substrate resistivity.

2. The thyristor of claim 1 further comprising planar electrode means contacting said anode region on said one major surface and said cathode and grid regions on said other major surface.

3. The thyristor of claim 2 further comprising voltage source means connected to said electrode means for causing the formation of depletion regions around each of said buried grid regions, the intersection of adjacent depletion regions causing current flow from anode to cathode regions to be terminated.

4. The thyristor of claim 3 wherein said voltage source means includes a first voltage source electrically connected to said grid and cathode regions and a second voltage source electrically connected to said anode and cathode regions through a load impedance.

5. The thyristor of claim 1 wherein said substrate comprises silicon of N-type conductivity and said grid and anode regions are of P-type conductivity.

* * * * *